United States Patent [19]

Holce et al.

[11] 4,335,270
[45] Jun. 15, 1982

[54] SWITCH HOUSING INCORPORATING FLEXIBLY ATTACHED MOUNTING PLATE

[75] Inventors: Thomas J. Holce, Portland; Charles M. Huckins, Tigard, both of Oreg.

[73] Assignee: Sentrol, Inc., Portland, Oreg.

[21] Appl. No.: 197,522

[22] Filed: Oct. 16, 1980

[51] Int. Cl.³ ............................................. H05K 5/00
[52] U.S. Cl. .................................. 174/52 R; 174/48; 248/506; 335/202
[58] Field of Search ................... 174/48, 49, 50, 52 R, 174/67; 248/359, 360, 506; 335/202, 205, 151, 154; 200/294, 295

[56] References Cited

U.S. PATENT DOCUMENTS

| | | | |
|---|---|---|---|
| 2,880,264 | 3/1959 | Ruskin | 174/48 X |
| 3,621,115 | 11/1971 | Kolster | 174/67 |
| 3,692,920 | 9/1972 | Santarelli | 174/48 |
| 3,699,580 | 10/1972 | Joseph | 174/153 A X |
| 4,070,078 | 1/1978 | Chrones | 174/67 X |

Primary Examiner—B. A. Reynolds
Assistant Examiner—D. A. Tone
Attorney, Agent, or Firm—Chernoff & Vilhauer

[57] ABSTRACT

A unitary housing defining a cavity for protectively containing a fragile component such as a glass encapsulated magnetic reed switch includes a mounting plate and a protective body interconnected by a thin flexible member which extends between one end of the body of the housing and one end of the mounting plate. The mounting plate includes apertures for receiving fasteners. A resiliently flexible loop is attached to the end of the mounting plate opposite the flexible connecting member, and a protuberance is provided on the end of the body of the housing opposite the flexible interconnecting member. When the body of the housing is positioned parallel to the mounting plate, the flexible interconnecting member and the resiliently flexible loop latch together, holding the body of the housing closely adjacent to the mounting plate. The flexibly attached mounting plate may be easily removed from the body of the housing, permitting the housing to be attached to a surface by the use of an adhesive.

5 Claims, 7 Drawing Figures

U.S. Patent  Jun. 15, 1982  4,335,270
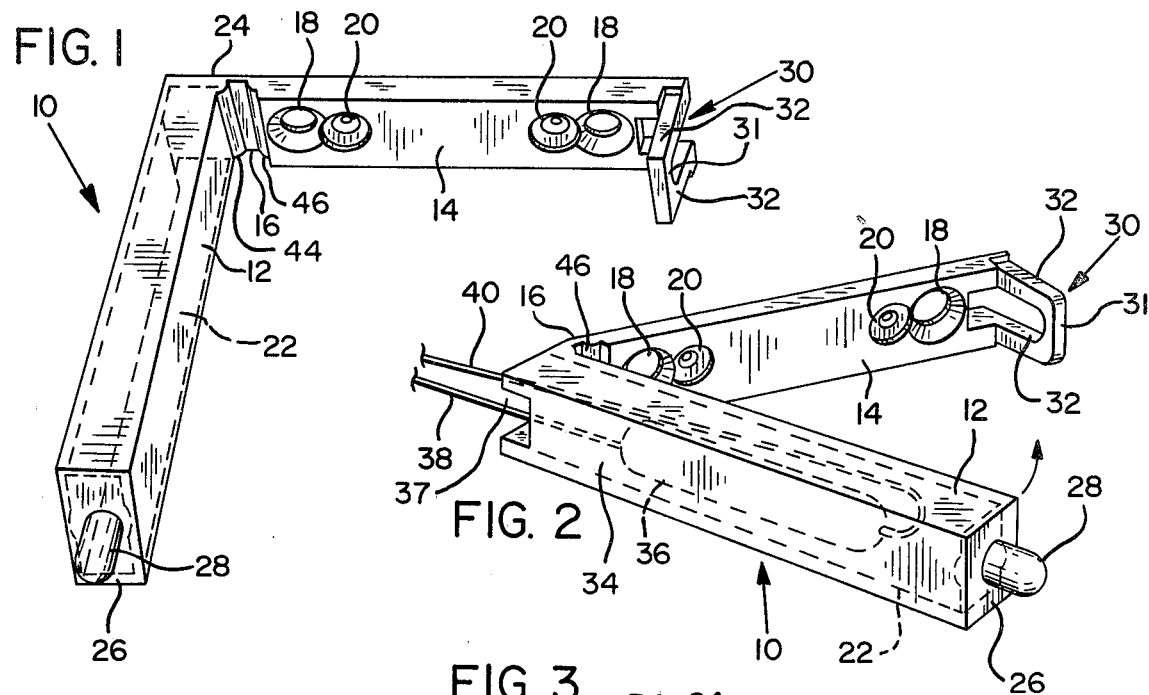
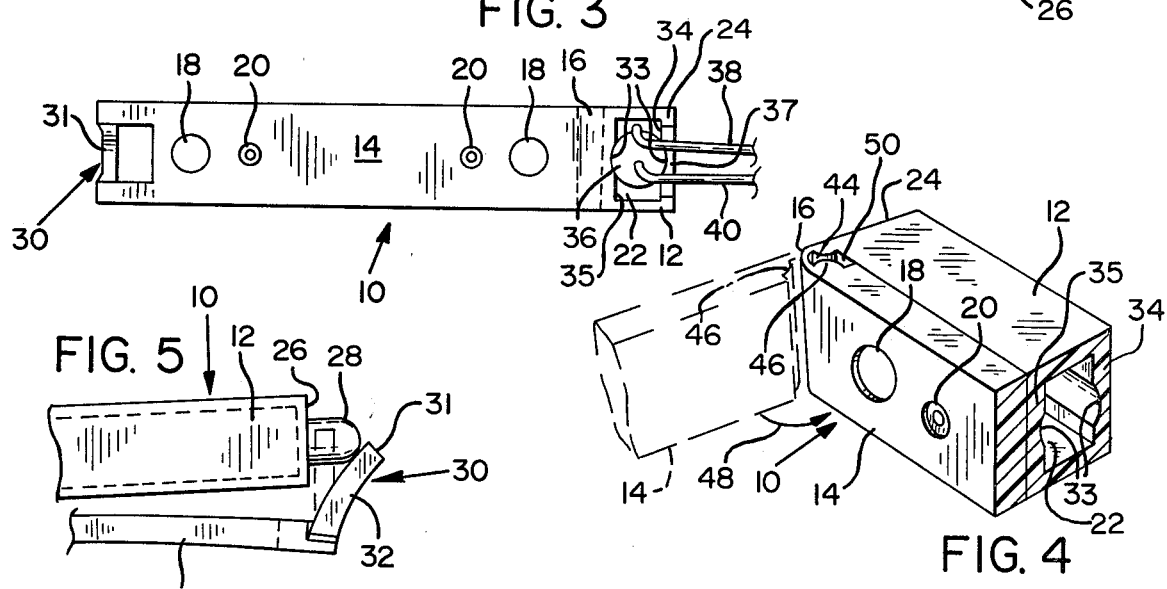
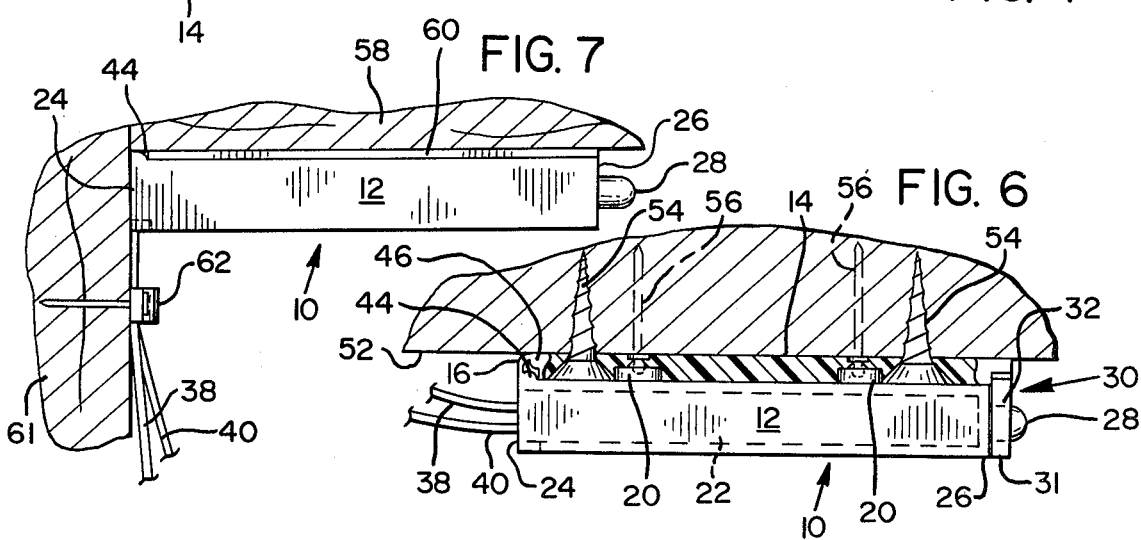

SWITCH HOUSING INCORPORATING FLEXIBLY ATTACHED MOUNTING PLATE

BACKGROUND OF THE INVENTION

The present invention relates to housings for fragile electrical components, and particularly to a protective housing incorporating a flexibly attached mounting plate.

Magnetic reed switches are frequently used to control the state of electrical position monitoring and control circuitry by sensing the proximity or absence of an actuating magnet which may be carried on a door, window frame, or a part of a mechanism whose position is being monitored. Commonly, the amount of power used in such sensing and control circuitry is quite small, permitting the reliable use of magnetic reed switches which are quite small and are encapsulated in glass to protect the magnetic reed contacts from the corrosive effects of the atmosphere.

Because of the fragility of the small glass capsules containing the magnetic reed switches, it has been common in the past to use a fairly large housing to mount the magnetic reed switches. This has previously been necessary to avoid damaging the glass switch capsule during tightening of mounting screws or while driving tacks used to mount such switch housings. Especially when such a switch housing is mounted on a surface which is not completely flat, the stress caused by installing the fasteners used to mount the switch housing can cause damage to the magnetic reed switch.

Frequently, in order to provide required stiffness, such prior art switch housings are made of metal, which provides ample protection for such a reed switch. Such protection is frequently unnecessary, however, and the use of such metal housings is therefore unnecessarily expensive.

Because of their large size, such prior art switch housings are visually very obvious, a disadvantage in the use of such housings in physical security circuits for monitoring the position of doors, windows, and the like. Because they take up a considerable amount of space, such prior art switch housings are disadvantageous, as well, in many industrial equipment position sensing applications.

Previously known switch housings have been attached to surfaces by means of exposed screws or nails. These are, perhaps, necessary for security, but when exposed to view they detract from a pleasant appearance. While in some applications a small encapsulated magnetic reed switch can be securely mounted by the use of adhesive materials, some protection for the glass capsule containing the switch is still necessary.

What is desired, therefore, is a small protective housing for a small electrical component such as a magnetic reed switch, including provisions for attaching the switch housing to a surface by secure means such as screws or nails without leaving such fasteners unattractively exposed to view. Such a housing should be capable of being mounted without danger of damaging the fragile electrical component contained in the housing as a result of over tightening mounting screws or as a result of shock incurred during the driving of tacks and brads. It is also desirable to provide a protective housing which may be mounted by means other than such secure fasteners where desired.

SUMMARY OF THE INVENTION

The present invention overcomes the aforementioned shortcomings and disadvantages of the previously known housings for protectively mounting small fragile electrical components, by providing a compact molded plastic switch housing incorporating a flexibly attached mounting plate. The mounting plate permits the use of mounting screws or nails without risk of damage to the electrical components contained in the housing, which, when installed, hides the mounting screws or nails used to secure the mounting plate to a surface on which the switch is to be mounted. Furthermore, the mounting plate of the housing of the present invention is easily removable to permit adhesive mounting of the housing directly on a surface where mounting screws and the like are not required.

The housing of the present invention is preferably manufactured of a material such as a tough plastic which may be injection molded. The body of the housing is an elongate, generally rectangular, member containing a cavity for receiving an electrical component, while one end of the housing is open to permit insertion of the electrical component.

A mounting plate including holes to receive screws or nails is flexibly attached to the open end of the body of the housing by a molded connecting strip which is thin enough to be easily flexible, permitting the mounting plate to be folded to a position closely alongside and parallel to the body of the housing. The mounting plate and body of the housing are of corresponding lengths, and an integrally formed latch is provided to hold the body closely alongside the mounting plate.

As part of the latch, the end of the body opposite the open end is closed and has a nipple extending therefrom. A stirrup or "U" shaped loop extends generally perpendicularly away from the principal plane of the mounting plate, toward the body of the housing when the body of the housing and the mounting plate are folded parallel to one another. The loop then fits around the nipple extending from the closed end of the body. The material of which the housing is made is flexible enough to permit the loop to pass over the end of the nipple and resiliently engage the nipple, latching the body of the housing snugly alongside the mounting plate.

It is desired to mount the body of the housing to a surface by adhesives, the flexible connecting strip may be cut easily with electricians' diagonal cutting pliers or a knife, to remove the mounting plate. Double faced adhesive tape or a suitable glue may then be conveniently used to mount the body of the housing.

It is therefore a principal objective of the present invention to provide an improved protective housing for containing a fragile electrical component.

It is another important objective of the present invention to provide such a protective housing which is compact in size and may be securely mounted without damaging the fragile electrical component contained therein.

It is another objective of the present invention to provide a housing for an electrical component permitting the electrical component to be secured to a surface in an attractive manner.

It is yet a further objective of the present invention to provide a housing for an electrical component which may be mounted using either screws, nails, or adhesives, as desired by the installer.

It is a principal feature of the present invention that it provides an inexpensive molded housing in which a protective body is flexibly connected to a mounting plate, preventing transfer of damaging stresses to the fragile electrical component during attachment of the mounting plate to a surface.

It is another important feature of the present invention that it includes an integrally molded resilient latch for holding the body of the housing flush against a mounting plate, covering the fasteners used to attach the mounting plate to a surface.

It is another feature of the present invention that it includes an easily severable connecting strip which makes the mounting plate easily removable from the protective body of the housing to permit adhesive mounting of the housing.

It is yet a further feature of the present invention that it provides a protective housing including a cutaway portion permitting electrical conductors to be bent perpendicular to the length of the housing to permit mounting an electrical component in a corner.

It is a primary advantage of the present invention that it provides a versatile protective housing which may be securely mounted to a surface by the use of screws or nails without damage to the fragile electrical component housed therein, which is cheaper than the previously available protective housings.

It is another important advantage of the present invention that it provides a housing for small fragile electrical components which is smaller than previously available housings for such components, permitting such components to be mounted securely in restrictive spaces and without being as obtrusive as when using previously available housings.

It is a further advantage of the present invention that it provides a protective housing which is much less expensive to produce, yet provides protection equal to that available in previously known housings for fragile electrical components.

It is yet a further advantage of the present invention that it provides a housing for a fragile electrical component which may be more easily converted than previous housings to facilitate mounting by the use of adhesives.

The foregoing and other objectives, features and advantages of the present invention will be more easily understood upon consideration of the following detailed description of the invention taken in conjunction with the accompanying drawings.

BRIEF DESCRIPTION OF THE DRAWINGS

FIG. 1 is a pictorial view of a switch housing incorporating the present invention.

FIG. 2 is a pictorial view of the housing shown in FIG. 1, with the body of the housing folded to a position approaching the mounting plate.

FIG. 3 is a rear elevational view of the housing shown in FIG. 1.

FIG. 4 is a pictorial detail view, at an enlarged scale, showing the flexible connecting portion of the housing shown in FIG. 1.

FIG. 5 is a top view of the latch portion of the housing shown in FIG. 1.

FIG. 6 is a top view of the housing shown in FIG. 1, installed on a surface by the use of mounting screws.

FIG. 7 is a top view of the housing of FIG. 1, with the mounting plate removed, mounted on a surface by the use of adhesives.

DETAILED DESCRIPTION OF THE INVENTION

Referring now to the drawings, an exemplary housing 10 for a fragile electrical component, embodying the present invention, may be seen to comprise an elongate protective body 12 attached to a mounting plate 14 by a flexible interconnecting portion 16.

The flexible interconnecting portion 16, as seen most clearly in FIG. 4, is very thin in comparison to the remainder of the housing 10. Since the housing is preferably made of material such as an injection molded plastic, the strength of the flexible interconnecting portion 16 is limited by its thickness, which is preferably small enough to permit easy flexing, yet great enough to safely support the body 12 of the housing.

In the mounting plate 14 are a pair of screw holes 18 and a pair of nail holes 20 usable for attaching the mounting plate to a surface by means of screws, nails, or similar fasteners. A cavity 22 is defined within the body 12, extending from an open end 24 of the body 12 toward a closed end 26 of the body. A nipple 28 extends from the closed end of the body 12, while a retaining loop 30 having a top portion 31 and sides 32 extends generally perpendicularly from the mounting plate 14.

The body 12 is generally rectangular and elongate, having nearly a square cross sectional shape, while the cavity 22 defined within the body is similarly generally rectangular and somewhat smaller in size. Arcuate grooves 33 are defined in a pair of opposite walls 34 and 35 of the cavity, to fit against the exterior of a generally cylindrical electrical component such as an encapsulated magnetic reed switch 36, to resiliently grip and frictionally hold the reed switch 36 within the cavity.

The wall 35 of the cavity 22 ends a short distance from the open end 24 of the body 12, opposite the flexible interconnecting portion 16, to provide a relief opening 37, through which electrical conductors 38 and 40, connected to an electric component such as the magnetic reed switch 36, may extend perpendicular to the length of the body 12, as shown in FIGS. 3 and 7.

Referring now particularly to FIG. 4, a quarter-round section 44 extends along the edge of the wall 34 to which the flexible interconnecting portion 16 is attached, and a similar quarter-round section 46 extends along the edge of the mounting plate 14 to which the flexible interconnecting portion 16 is attached, so that when the mounting plate 14 is moved in the direction indicated by the arrow 48, to a position parallel to an exterior surface of the body 12, some open space 50 is left to allow for variations resulting from mass production by accommodating the bending characteristics of the flexible interconnecting portion 16 of the particular housing.

Referring now to FIG. 5, it will be seen that as the body 12 is moved to a position parallel to the mounting plate 14, the nipple 28 comes into contact with the top 31 of the loop 30, causing the legs 32 of the loop, and possibly a portion of the mounting plate 14, to flex outwardly and away from the closed end 26 of body 12 as the body approaches a position closely alongside and parallel with the mounting plate. When the body 12 is closely adjacent to the mounting plate, the flexible loop 30 resiliently returns to its original position relative to the mounting plate 14, encompassing the nipple 28 and thereby holding the body 12 closely adjacent and parallel to the mounting plate 14.

As shown in FIG. 6, the latching of the loop 30 over the nipple 28 permits the mounting bracket 14 to be fastened securely to a wall 52 by the use of screws 54 or nails 56, while the body 12 extends generally perpendicularly away from the wall 52 and is thus far enough from the mounting plate 14 not to obstruct installation of the fasteners. The screws 54 or nails 56 may be driven through the mounting bracket 14 into the wall 52 without transmitting any appreciable stress through the flexible interconnecting portion 16 to the body 12 of the housing. Thereafter, the body 12 may be swung alongside the mounting bracket 14, by bending the flexible interconnecting portion 6, until the loop 30 latches around the nipple 28, holding the body 12 closely alongside the bracket 14.

In using the housing 10 of the invention there is therefore practically no danger of damaging fragile electrical components during mounting as is often likely with previously known switch housings not incorporating such a flexibly attached mounting plate. At the same time, however, the body 12 of the housing protectively surrounds a fragile electrical component, protecting it from the normal hazards of the environment.

The housing 10 of the invention may also be mounted by adhesives in a location where it is not desirable to use such fasteners as screws or nails, as shown in FIG. 7. The flexible interconnecting portion 16 is preferably weak enough to permit the body 12 to be separated from the mounting plate 14 by the use of diagonal cutting pliers or a knife. This permits the body 12 to be mounted in a corner by the use of glue or a length of adhesive tape 60 having two opposed adhesive faces. The conductors 38 and 40 from the electrical component contained within the body 12 extend perpendicularly through the relief opening 37 and along a wall 61, and a staple 62 provides additional support for the conductors 38 and 40.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A protective housing for a fragile electrical component, comprising:
   (a) a protective body having an exterior surface and defining cavity means for receiving said fragile electrical component;
   (b) a mounting plate including aperture means for receiving fasteners for attaching said mounting plate to a surface;
   (c) a flexible member interconnecting said mounting plate with said body and permitting said exterior surface of said body to be positioned parallel with and in contact with said mounting plate; and
   (d) latching means for retaining said exterior surface of said body in a position parallel with said mounting plate, said latching means comprising first and second latch members located respectively on said body and said mounting plate, said first latch member comprising a nipple protruding from said body and said second latch member comprising resiliently flexible retaining loop means extending outwardly from said mounting plate for resiliently passing over and, thereafter, fitting around said nipple to retain said body in said position.

2. The housing of claim 1, wherein said mounting plate and said body are elongated, said flexible member being located at one end thereof, and said latching means being located at the opposite end thereof, said flexible member comprising a relatively thin strip of the material of which said body and said mounting plate are formed.

3. The housing of claim 1, wherein said cavity means includes resilient means for gripping said fragile electrical component for holding it in a desired location within said cavity.

4. The housing of claim 1, said flexible member permitting said body to be moved between said position in which said exterior surface of said body is parallel with and in contact with said mounting plate, and a position in which said body is located far enough from said mounting plate to permit insertion of fasteners into said mounting plate without obstruction.

5. A protective housing for a fragile electrical component, comprising:
   (a) an elongate protective body, said body having an exterior surface, an open end, and a closed end and including elongate generally tubular cavity means extending along the length thereof from said open end toward said closed end, for receiving said fragile electrical component;
   (b) an elongate generally planar mounting plate including aperture means for receiving fasteners for attaching said mounting plate to a surface;
   (c) a flexible member interconnecting said open end of said elongate protective body with an end of said mounting plate and permitting a portion of said exterior surface of said body to be positioned parallel with and in contact with said mounting plate;
   (d) latch means associated with said closed end for retaining said protective body in a position wherein said portion of said exterior surface is located parallel with and closely alongside said mounting plate and wherein said tubular cavity means is oriented parallel to said mounting plate; and
   (e) means defining a relief opening in said body located adjacent to said open end for permitting electrical conductors to extend from said electrical component in a direction perpendicular to the length of said generally tubular cavity means.

* * * * *